US008212146B1

(12) United States Patent
Moore

(10) Patent No.: US 8,212,146 B1
(45) Date of Patent: Jul. 3, 2012

(54) COVER PANEL FOR ELECTRICAL OUTLETS

(76) Inventor: Steve F. Moore, Greenwood Village, CO (US)

( * ) Notice: Subject to any disclaimer, the term of this patent is extended or adjusted under 35 U.S.C. 154(b) by 215 days.

(21) Appl. No.: 12/749,417

(22) Filed: Mar. 29, 2010

Related U.S. Application Data

(63) Continuation-in-part of application No. 11/699,055, filed on Jan. 29, 2007, now abandoned.

(51) Int. Cl.
*H05K 5/03* (2006.01)

(52) U.S. Cl. ............ 174/66; 174/67; 220/241; 220/242; 439/149

(58) Field of Classification Search .................... 174/66, 174/67; 220/241, 242; D8/353; D13/177; 439/142, 135, 148, 149
See application file for complete search history.

(56) References Cited

U.S. PATENT DOCUMENTS 3,859,454 A 1/1975 Mann
5,285,014 A 2/1994 Gilchrist
5,375,728 A * 12/1994 West .............................. 220/3.8
5,900,584 A 5/1999 Cady et al.
6,051,788 A 4/2000 Nichols
6,309,239 B1 10/2001 Johnston
6,664,471 B1 * 12/2003 Howe, Jr. ........................ 174/66
6,674,003 B1 * 1/2004 Torres ............................. 174/66
6,703,562 B1 * 3/2004 Pacheco .......................... 174/66
6,897,381 B2 5/2005 He et al.
7,070,426 B2 * 7/2006 DeCell et al. ................. 439/135
7,071,414 B2 7/2006 Kim
7,094,969 B1 8/2006 In
7,119,278 B1 10/2006 Shotey
7,456,359 B1 * 11/2008 Tidd ................................ 174/66
D638,281 S * 5/2011 Weymouth ..................... D8/353

* cited by examiner

*Primary Examiner* — Angel R Estrada
(74) *Attorney, Agent, or Firm* — Albert Haegele; Layendecker & Lemire, LLC

(57) ABSTRACT

A cover panel is described that plugs into unused electrical outlets and camouflages or conceals the receptacle and faceplate and creates a safety barrier to the electrical components of an unused electrical outlet is described. Embodiments of the cover panel include a solid panel front surface of non-conductive molded material with a paintable surface on the outside and posts adapted to fit into the orifices of an electrical socket on the inside. The cover panel fits over the outlet's faceplate and is "plugged" into the socket, requiring no tools to install or remove. Embodiments of the cover panel have a paintable surface which can be painted to match or complement nearby walls camouflaging unused outlets. The painted cover panel serves as a physical barrier to the electrical outlet, and makes the electrical outlet less conspicuous. Embodiments include cover panels containing recycled acrylonitrile butadiene styrene.

20 Claims, 3 Drawing Sheets

COVER PANEL FOR ELECTRICAL OUTLETS

The present application is a continuation-in-part of, and therefore claims priority to and incorporates by reference, U.S. patent application Ser. No. 11/699,055, entitled DECOR AND SAFETY COVER PANEL FOR ELECTRICAL OUTLETS, filed 29 Jan. 2007, and having the same inventor as the present application.

FIELD OF THE INVENTION

The present invention relates generally to panels adapted to plug into unused electrical outlets, over the faceplate.

BACKGROUND

Unused electrical outlets are unsightly and are an unsafe, unattractive nuisance. Homes and commercial buildings have many more electrical outlets than are needed at any one time because current building codes in the United States require that there be no longer than a six foot floor run to an available electrical outlet. Consequently, contemporary homes and commercial buildings and older homes and commercial buildings that are remodeled and meet current building codes have many excess electrical outlets. These unused electrical outlets distract from the decor of a room because they do not blend with the paint color of the walls. And, the increased number of electrical outlets simply provides increased opportunities for the occupants of a room to come in contact with electrical hazards.

Standard electrical outlets include socket mechanisms and unpainted faceplates generally available in limited colors Contemporary homes have walls painted with off white, pastel, or rich dark colors. Typical electrical outlets, spaced frequently along a wall, contrast and distract from the uniform appearance of the painted wall and become very noticeable because they do not blend with the wall. The increased number of unused outlets, combined with the fact that they stand out from the wall, creates an increased number of unsafe, unattractive nuisances and increases risk of human exposure to active electrical elements. Occupants of a room are confronted with these excess electrical outlets and may find them to be a visually unpleasant and potentially hazardous. Devices exist to either improve the appearance of electrical outlets or provide a safety barrier to humans; however, no product exists that accomplishes both.

Decor enhancing devices exist for electrical outlets which replace the faceplate to make the "socket" portion of an electrical outlet more visually appealing, or to conceal unsightly screws, or provide an appealing frame to an outlet. All decor related devices provide access to the electrical components of the wall socket and are not intended to reduce hazard.

In U.S. Pat. No. 7,119,278, a cover plate exists that is thin and rectangularly shaped, with apertures to receive plug blades, which replaces the faceplate and is attached to the socket mechanism with a screw. This device addresses the problem of paint buildup on the electrical socket after many years of redecorating and repainting. Although faceplates can easily be removed during wall painting, the socket itself is considered permanent and is subject to being defaced from dripping or spattering paint. This device makes the outlet more aesthetically pleasing by providing a thin flat mask, that maintains the outlet's functionality, that, prior to wall painting, can be removed by unscrewing the center set screw, and reinstalled when paint is dry, covering any paint that has accidentally spattered onto the original, permanent outlet socket. These cover plates are available in a variety of manufacturer selected colors. A screwdriver is required for its use.

In U.S. Pat. No. 4,676,570, a cover plate exists to replace a standard faceplate, which is attached with a center screw, with a plate that attaches to the electrical socket using concealed flanges for a "snap fit" to the outlet. The purpose of this device is to cover unsightly screws.

In U.S. Pat. No. 6,664,471, a removable socket cover exists, consisting of a panel and sidewalls, for the purpose of temporarily protecting the socket and wiring from paint drips and spatters during a painting project. It is installed by pressing it into place while painting a wall in the immediate proximity of the socket and then is removed and reinstalled over a different socket, as the painting progresses.

Safety cover devices restrict access to the electrical components of the wall socket through the use of overlay parts or enclosures. Electrical outlets for supplying electrical power to appliances and machines are common fixtures in homes and buildings. A persistent danger associated with electrical outlets is that children may insert their fingers or other objects into the openings of electrical outlets and be injured of killed or may cause injury to their surroundings. This is a particular risk when nothing is plugged into the openings of outlets, making them inviting targets for children's curiosity.

In U.S. Pat. No. 7,094,969 and U.S. Pat. No. 6,159,034, safety related devices exist that cover electrical outlets and sockets by attaching a pivoting, hinged or sliding door apparatus. This device is oversized in length, width, and depth and protrudes from the wall and requires a tool for the removal of the existing face plate.

In U.S. Pat. No. 6,309,239, attaching a hinged boxlike plug enclosure covers provides a barrier to the electrical outlet. This device is oversized in length, width, and depth and protrudes from the wall and requires a tool for the removal of the existing face plate.

In U.S. Pat. No. 6,051,788, attaching a thick faceplate that prevents simultaneous contact of the fingers of a person holding a plug with the bare metal prong as it contacts the receptacle's electrical contacts. This device is oversized in length, width, and depth and protrudes from the wall and requires a tool for the removal of the existing face plate.

Other safety devices are small, about the size of a quarter, and cover only the orifice area of the socket. They are attached by being inserted into the active, "hot" orifices of the electrical mechanism, blocking access to the receptacle's electrical mechanism.

Many devices have been created to enhance the appearance of electrical outlets, but they provide no safety barrier between the electrical mechanism and the occupants of a room and require tools for installation and reinstallation, and most require the removal of the faceplate.

One device, that replaces a faceplate, sites a primary objective as hiding the screws that secure the device to the wall using adaptors with openings that allow the decorative cover to snap into place. This snap-on method, however, requires costly manufacturing processes and may be too expensive for the average homeowner. These cover plates provide a "snap fit" with a corresponding flange. Typically, one or both of the flange portions, and the corresponding elements, must bend somewhat to engage the cover plate. This configuration is troublesome because it is difficult to remove the cover plate and each removal and reengagement produces some bending and fatigue. Repeated removal and reengagement can lead to damage and possibly failure of the device.

Other cover plates mount over the electrical socket, after removal of the faceplate, and have apertures for plug blades and a center hole for receiving a screw to secure it to the socket. The intent of this device is to replace the faceplate and cover the entire outlet, with openings only the size of plug blades, unlike a faceplate which only masks the wall opening and wiring associated with the socket. The cover will mask any paint that has spattered or dripped onto the socket, but is only available in colors selected by the manufacturer, which will not exactly match a wall's paint color or will have to be changed if the paint color of the wall changes. This device requires tools to install and does not eliminate the need for unattractive screws.

Devices have been created to limit children's access to the openings in electrical outlets, but they are unsightly and detract from room decor and require tools to install and reinstall.

Boxlike outer covers that lock over a base plate, with hinged, doorlike openings for passage of an electric cords offer substantial protection, however, they are unsightly and it may be prohibitively expensive to use these devices for every outlet in the home or building. A stop bar blocks access to the outlet by children, and the locks on the device are covered by the outer cover and can be released only by an external, magnetic force. If an electrical hazard develops and a user needs to quickly open the outlet cover, they must first have the device providing the magnetic force available, in order to open the door and disengage the plug from the socket. It is critical for safety that it be readily openable by an adult.

Covers with sliding or swinging "doorlike" parts that cover the orifices of an electrical socket, or devices where the entire cover slides or swings out of place provide protection from hazard but the complexity of these safety covers and the difficulty of use, as well as the space required, particularly when opened, limits their practicality. This type of safety cover uses a variety of parts that are most apt to be lost, suffer breakage, and which require an inordinate amount of time to install, and are complex and expensive to procure.

Plastic safety plugs with prongs that fit snugly into openings are readily available, however, being visible, safety plugs may themselves be taken as a challenge for removal by some children. These small safety plugs are a hazard to children as they are small enough for a child to put it into its mouth. Additionally, the small, pronged plugs, installed in a socket may be a tempting challenge to a child who sees it as a toy.

BRIEF DESCRIPTION OF THE DRAWINGS

For purposes of clarity and brevity, like elements and components will bear the same designations and numbering throughout the Figures.

DETAILED DESCRIPTION

Figure 1:
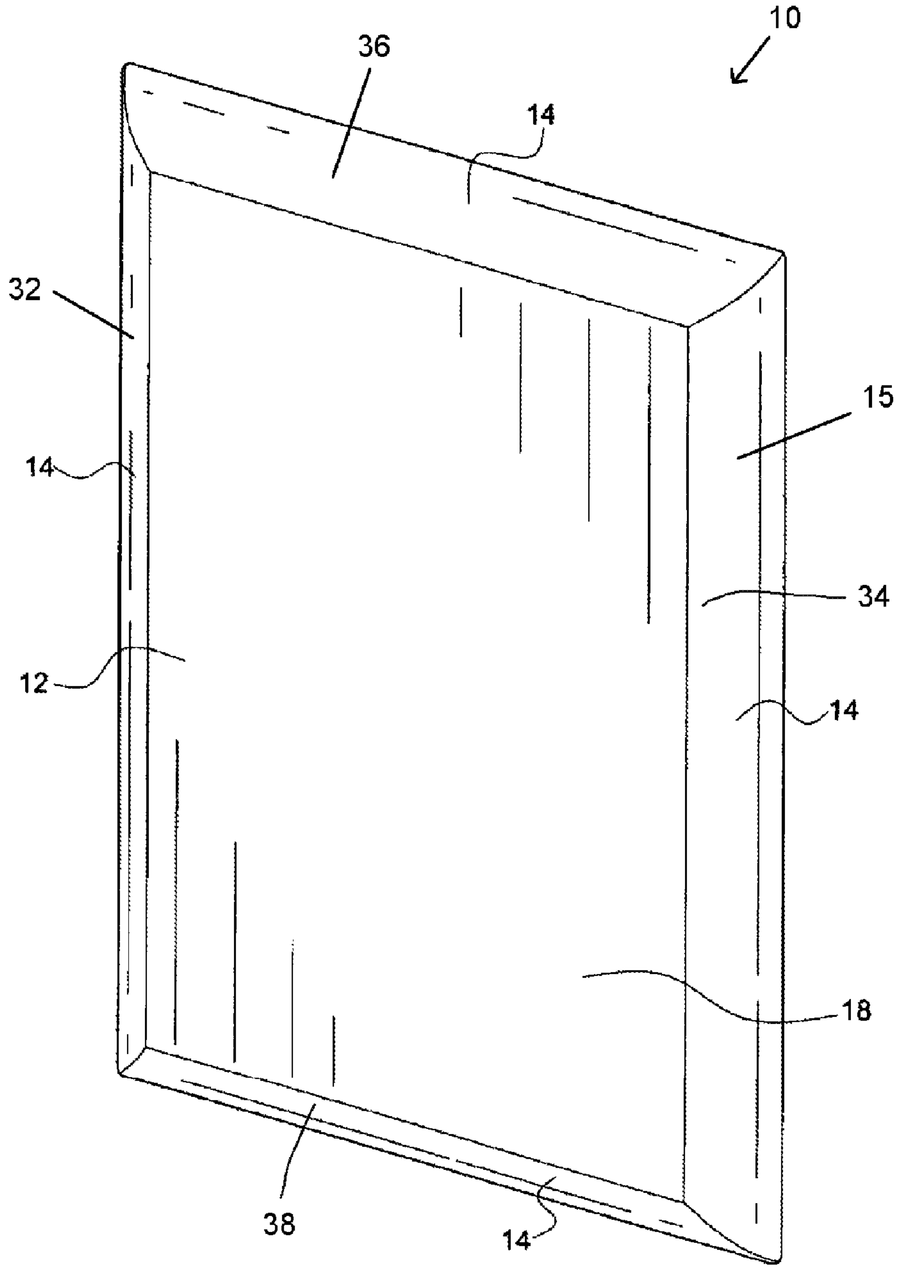
FIG. 1 is a front, perspective view of a cover panel according to an embodiment of the present invention.

In accordance with embodiments of the present invention, there is provided here a cover panel for electrical outlets comprising a simple, one piece, panel, that camouflages unused electrical outlets (socket and faceplate) and creates a safety barrier to the electrical components of an electrical socket. Some embodiments comprise a single product having multiple purposes. The cover panel is typically larger than a standard double outlet faceplate, with a paintable solid panel surface on the outside (front). On the underside (back) reside a plurality of posts shaped and positioned to fit into orifices of an electrical socket. Installation does not require removal of the faceplate. The cover panel fits over the outlet's faceplate and is "plugged" into the electrical socket, requiring no screws or tools to install, remove, and reinstall. It has a paintable solid panel front surface which can be covered with the paint used on the surrounding walls making the unused outlet blend with the wall to improve the appearance of the room. It can be moved and repainted as the room's decor changes. The painted cover panel serves as a barrier to potential electrical hazard and discourages tampering, by making it less pronounced.

In some embodiments, the cover panel comprises Acrylonitrile Butadiene Styrene (ABS), to which latex and other paints adhere relatively well. Variations of cover panels comprise recycled ABS, which is typically, but not necessarily, post-industrial or post-consumer recycled ABS. In some embodiments, industrial ABS scrap is recycled, and in some embodiments products made from ABS are shredded, powdered, or similarly physically reduced before being blended with virgin ABS for making cover plates according to the present invention.

Terminology

The terms and phrases as indicated in quotation marks (" ") in this section are intended to have the meaning ascribed to them in this Terminology section applied to them throughout this document, including in the claims, unless clearly indicated otherwise in context. Further, as applicable, the stated definitions are to apply, regardless of the word or phrase's case, to the singular and plural variations of the defined word or phrase.

The term "or" as used in this specification and the appended claims is not meant to be exclusive; rather the term is inclusive, meaning either or both.

References in the specification to "one embodiment", "an embodiment", "another embodiment, "a preferred embodiment", "an alternative embodiment", "one variation", "a variation" and similar phrases mean that a particular feature, structure, or characteristic described in connection with the embodiment or variation, is included in at least an embodiment or variation of the invention. The phrase "in one embodiment", "in one variation" or similar phrases, as used in various places in the specification, are not necessarily meant to refer to the same embodiment or the same variation.

The term "couple" or "coupled" as used in this specification and appended claims refers to an indirect or direct physical connection between the identified elements, components, or objects. Often the manner of the coupling will be related specifically to the manner in which the two coupled elements interact.

The term "approximately," as used in this specification and appended claims, refers to plus or minus 10% of the value given.

The term "about," as used in this specification and appended claims, refers to plus or minus 20% of the value given.

A First Embodiment Cover Panel

Figure 2:
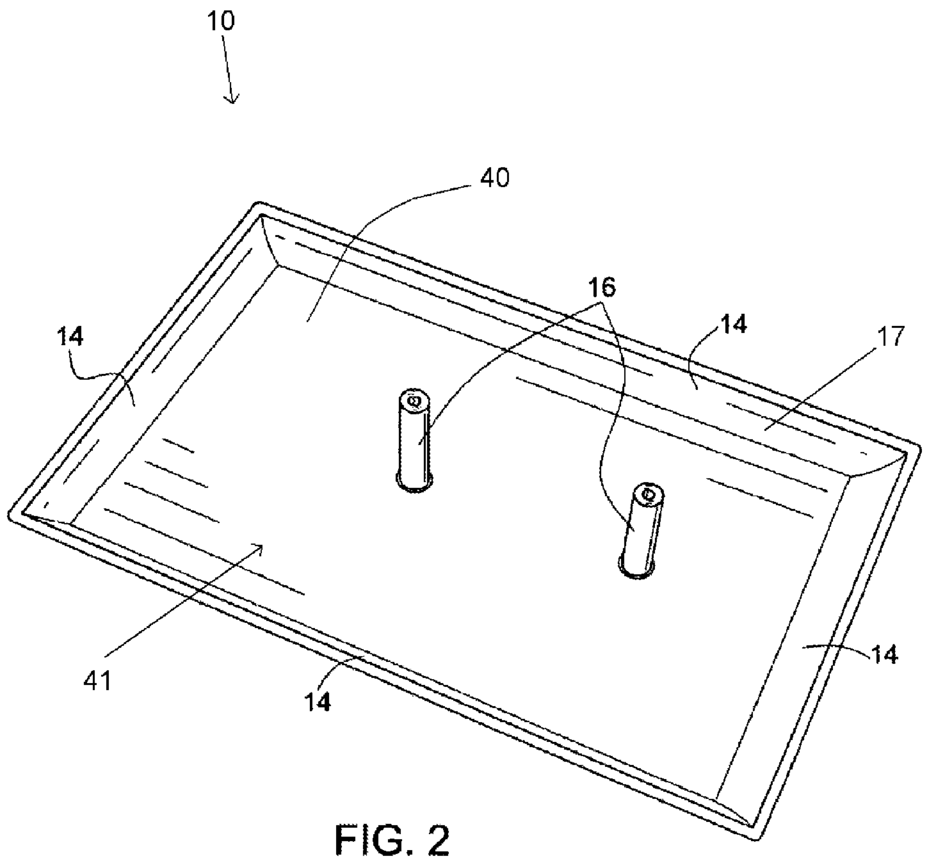
FIG. 2 is a back, perspective view of a cover panel according to an embodiment of the present invention.
Figure 3:
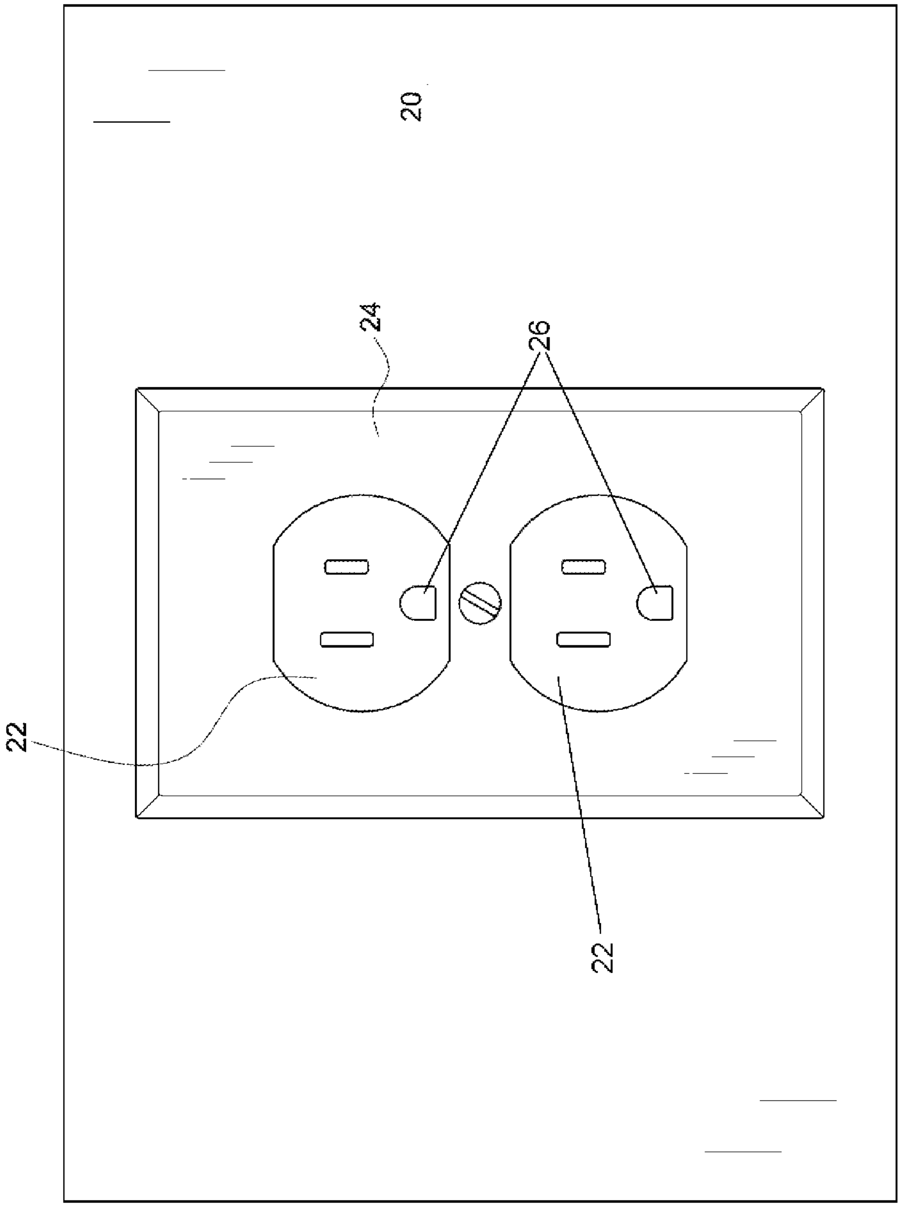
FIG. 3 is a front, pan view of a cover panel according to an embodiment of the present invention.

A first embodiment cover panel 10 is illustrated in FIGS. 1-3. The first embodiment comprises a solid panel front surface 12 and a beveled edge 14, the solid panel front surface and beveled edge forming a contiguous front of the cover panel. The solid panel front surface 12 is substantially planar and devoid of features or apertures, and covers the substantially entire front of the cover panel within the beveled edge, as best illustrated in FIG. 1.

The beveled edge 14 surrounds the solid panel front surface, the beveled edge comprising a left side 32, right side 34, top side 36, and bottom side 38. The beveled edge 14 is convexly curved from the solid panel front surface 12 on the beveled edge front side 15, which allows the cover panel to cover two electrical outlets 22, including the faceplate 24 that surrounds the two electrical outlets 22. The two electrical outlets together form a pair of electrical outlets, also referred to as a duplex outlet by persons skilled in the art.

The first embodiment cover panel has width and length dimensions that are larger than the width and length dimensions of a duplex or double outlet faceplate 24 for a standard duplex outlet 22, the faceplate 24 and duplex outlet being illustrated in FIG. 3. The first embodiment is molded with a resin, or similar material, that has paint bonding characteristics, giving it a paintable surface that is intended to be painted with the same paint as used on a surrounding wall 20.

Thus the electrical outlets 22, including the duplex or double outlet face plate 24, are obscured from view all around the outlet and face plate, including from the left, right, top, and bottom. The first embodiment cover panel 10 has one piece construction, the one piece construction having no moving parts, seams, or joints. The one piece construction is also known as unitary construction or unitary piece construction. The first embodiment cover panel comprises Acrylonitrile Butadiene Styrene (ABS), and variations include recycled ABS. The first embodiment cover panel preferably includes a combination of virgin ABS and recycled ABS, more preferably includes 1% to 50% by weight recycled ABS, and most preferably includes about 5% by weight recycled ABS. Where the cover panel comprises 5% ABS, the balance is typically, but not necessarily, virgin ABS. Other embodiments may comprise other suitable non conductive material, which provides a barrier to, and insulates, occupants of the room from the electrical mechanism of the outlet.

The first embodiment cover panel further comprises a back panel surface 40 as illustrated in FIG. 2, the beveled edge 14 surrounding the back panel surface. The beveled edge 14 is concave on a beveled edge back side 17 when viewed from an underside (back) view, as in FIG. 2. The beveled edge 14 forms a cavity 41, which enables the cover panel to be placed over a standard outlet faceplate and conform to the shape of the faceplate. The first embodiment has the depth required to encase a standard duplex outlet faceplate within the cavity 41. The underside exposes a protruding dual post set (protrusions) 16, formed substantially perpendicular to the back panel surface, shaped to conform to the size and depth, and positioned to correspond with the location, of orifices of a standard electrical socket. Said dual post set 16 fits snuggly when inserted into the electrical socket's corresponding orifices, and provides a secure means of attaching to the outlet. Said dual post set 16 is positioned such that it is defined and that it is alignable with a corresponding orifice in a standard electrical socket. In the first embodiment, the corresponding orifices of the electrical socket are ground plug orifices.

Alternative Embodiments and Variations

The various embodiments and variations thereof, illustrated in the accompanying Figures and/or described above, are merely exemplary and are not meant to limit the scope of the invention. It is to be appreciated that numerous other variations of the invention have been contemplated, as would be obvious to one of ordinary skill in the art, given the benefit of this disclosure. All variations of the invention that read upon appended claims are intended and contemplated to be within the scope of the invention.

I claim:

1. A cover panel for covering one or more electrical outlets and an associated faceplate, the cover panel comprising:

a solid panel front surface, the solid panel front surface being substantially planar and residing on a front side of the cover panel;

a back panel surface, the back panel surface being parallel to the solid panel front surface and residing on a back side of the cover panel;

a beveled edge, the beveled edge surrounding the solid panel front surface and being convex on a front side and concave on a back side; and two or less protrusions extending from the back panel surface, each of the two or less protrusions being adapted to insertion into a ground plug orifice of an electrical outlet, wherein the cover panel is adapted to installation over the associated faceplate.

2. The cover panel of claim 1, wherein the cover panel is a one piece unit of a non-conductive material and the solid panel front surface covers an entire front of the cover panel within the beveled edge.

3. The cover panel of claim 2, wherein the solid panel front surface is devoid of apertures and both the solid panel front surface and the beveled edge are adapted to paint adherence.

4. The cover panel of claim 3, wherein the solid panel front surface comprises acrylonitrile butadiene styrene (ABS).

5. The cover panel of claim 4, wherein the solid panel front surface is covered with wall paint.

6. A cover panel combination comprising:

the cover panel of claim 5;

a wall, the two electrical outlets being installed in the wall and surrounded by a faceplate, the two or less protrusions residing in the ground plug orifice and the two electrical outlets and the faceplate being completely obscured behind the cover panel.

7. The combination of claim 6, wherein a surface of the wall is covered by the wall paint.

8. The combination of claim 7, wherein the solid panel front surface has dimensions larger than the dimensions of the faceplate.

9. The cover panel of claim 3, wherein the solid panel front surface comprises recycled acrylonitrile butadiene styrene (ABS).

10. The cover panel of claim 9, wherein the cover panel comprises about 5% acrylonitrile butadiene styrene (ABS) by weight.

11. The cover panel of claim 1, wherein each of the front surfaces of the top, bottom, left and right beveled edge portions are convex.

12. The cover panel of claim 11, wherein each of the back surfaces of the top, bottom, left and right beveled edge portions are concave.

13. A cover panel for a pair of electrical outlets and an associated standard duplex outlet faceplate, the cover panel comprising:

a solid plate portion having front and back surfaces;

beveled edge portions surrounding the solid plate portion, the beveled edge portions comprising front and rear beveled surfaces, the front plate surface and front beveled surface forming a solid contiguous front, and the rear plate surface and rear beveled surface forming a cavity adapted to encase the standard double wall outlet faceplate when installed; and two or less protrusions extending from the rear plate surface, each of the two or less protrusions being adapted to insert into a ground plug orifice of a pair of electrical outlets, wherein the cover panel is adapted to installation over the associated faceplate.

14. The cover panel of claim 13, wherein the cover panel is molded from a non-conductive resin as a unitary piece.

15. The cover panel of claim 14 wherein the resin comprises recycled acrylonitrile butadiene styrene.

16. The cover panel of claim 15, wherein the cover panel is substantially rectangular.

17. The cover panel of claim 16, wherein the front surfaces of the beveled edges are convexly-shaped.

18. The cover panel of claim 17, wherein the back surfaces of the beveled edges are concavely-shaped.

19. A cover panel for covering one or more electrical outlets and an associated faceplate, the cover panel consisting essentially of:

a solid panel front surface, the solid panel front surface being substantially planar and residing on a front side of the cover panel;

a back panel surface, the back panel surface being parallel to the solid panel front surface and residing on a back side of the cover panel;

a beveled edge, the beveled edge surrounding the solid panel front surface and being convex on a front side and concave on a back side; and two or less protrusions extending from the back panel surface, each of the two or less protrusions being adapted to insertion into a ground plug orifice of an electrical outlet, wherein the cover panel is adapted to installation over the associated faceplate.

20. The cover panel of claim 19, wherein the cover panel consists essentially of a non-conductive material.

* * * * *